(12) United States Patent
Yamasawa et al.

(10) Patent No.: US 10,294,585 B2
(45) Date of Patent: May 21, 2019

(54) ALUMINA SUBSTRATE

(71) Applicant: TDK CORPORATION, Tokyo (JP)

(72) Inventors: Kazuhito Yamasawa, Tokyo (JP);
Atsushi Ohido, Tokyo (JP); Katsumi Kawasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 175 days.

(21) Appl. No.: 15/329,478

(22) PCT Filed: Aug. 6, 2015

(86) PCT No.: PCT/JP2015/072315
§ 371 (c)(1),
(2) Date: Jan. 26, 2017

(87) PCT Pub. No.: WO2016/024514
PCT Pub. Date: Feb. 18, 2016

(65) Prior Publication Data
US 2017/0211204 A1    Jul. 27, 2017

(30) Foreign Application Priority Data

Aug. 12, 2014    (JP) .................................. 2014-164067

(51) Int. Cl.
*C23C 16/34* (2006.01)
*C30B 29/40* (2006.01)
(Continued)

(52) U.S. Cl.
CPC ............ *C30B 29/403* (2013.01); *C30B 1/02* (2013.01); *C30B 1/10* (2013.01); *C30B 5/02* (2013.01); *C30B 9/12* (2013.01); *C30B 19/02* (2013.01); *C30B 19/08* (2013.01); *C30B 19/12* (2013.01); *C30B 25/02* (2013.01); *C30B 29/20* (2013.01); *H01L 21/0242* (2013.01);
(Continued)

(58) Field of Classification Search
USPC .................. 51/307, 309; 427/255.23, 255.28, 427/255.36, 255.39, 255.391, 255.394; 428/336, 697, 698, 699
See application file for complete search history.

(56) References Cited

U.S. PATENT DOCUMENTS

2005/0142391 A1* 6/2005 Dmitriev ................. C30B 25/00
                                                              428/698
2006/0175619 A1    8/2006 Fukuyama et al.
2010/0255304 A1   10/2010 Amano et al.

FOREIGN PATENT DOCUMENTS

JP          4457576 B    11/2004
JP     2006-213586 A     8/2006
(Continued)

OTHER PUBLICATIONS

Kallel et al "Optical characterization and crystal field calculation of Er(3+) in AlN epilayers" Journal of Lumn 134 (2013) p. 893-899. (Year: 2013).*
(Continued)

*Primary Examiner* — Archene A Turner
(74) *Attorney, Agent, or Firm* — Oliff PLC

(57) ABSTRACT

An alumina substrate wherein an AlN layer is formed on a surface of the alumina substrate and a rare earth elements-containing layer and/or rare earth elements-containing regions is/are formed in the interior of the AlN layer or in the interface between the AlN layer and the alumina substrate.

12 Claims, 7 Drawing Sheets

(51) Int. Cl.
- C30B 19/12 (2006.01)
- H01L 21/205 (2006.01)
- C30B 1/02 (2006.01)
- C30B 1/10 (2006.01)
- C30B 9/12 (2006.01)
- C30B 19/02 (2006.01)
- C30B 19/08 (2006.01)
- C30B 29/20 (2006.01)
- H01L 21/02 (2006.01)
- C30B 5/02 (2006.01)
- C30B 25/02 (2006.01)

(52) U.S. Cl.
CPC .... *H01L 21/0254* (2013.01); *H01L 21/02491* (2013.01); *H01L 21/02499* (2013.01); *H01L 21/02502* (2013.01); *H01L 21/02628* (2013.01); *H01L 21/205* (2013.01)

(56) References Cited

FOREIGN PATENT DOCUMENTS

| | | |
|---|---|---|
| JP | 4907127 B | 3/2007 |
| WO | 2009/066663 A1 | 5/2009 |

OTHER PUBLICATIONS

Metcalf et al "Near-infrared photoluminescence properties of neodymium in in situ doped AlN grown using plasma-assisted molecular beam epitaxy" Optical Materials Express 84, vol. 1, No. 1 (2011). (Year: 2011).*

Yang et al "Electron paramagnetic resonance of Er(3+) ions in aluminum nitride" Journ. of Appl. Phys. 105 (2009) 023714 (Year: 2009).*

Han et al "Effect of Gd implantation on the structural and magnetic properties of GaN and AlN". Appl. Phys. Lett. 88, (2006) 042102. (Year: 2006).*

Vetter et al "Crystal field analysis of Pm(3+)(4f4) and Sm(3+)(4f4) and lattice location studies of (147)Nd and (147)Pm in w-AlN". Phy.Rev. B 74, (2006) 205201. (Year: 2006).*

Mar. 12, 2018 Search Report issued in European Patent Application No. 15832383.2.

Jadwisienczak et al; "Visible emission from AlN doped with Eu and Tb ions;" Journal of Applied Physics; American Institute of Physics; vol. 89; No. 8; pp. 4384-4390; Apr. 15, 2001.

Lorenz et al; "Optical doping of AlN by rare earth implantation;" Nuclear Instruments & Methods in Physics Research, Section B: Beam Interactions With Materials and Atoms; vol. 242; No. 1; pp. 307-310; Sep. 16, 2005.

MacKenzie et al; "Er doping of III-nitrides during growth by metalorganic molecular beam epitaxy;" Journal of Crystal Growth, Elsevier, Amsterdam, NL; vol. 175-176; No. 3001; pp. 84-88; May 1, 1997.

Oct. 6, 2015 International Search Report issued in International Patent Application No. PCT/JP2015/072315.

Oct. 6, 2015 Written Opinion issued in International Patent Application No. PCT/JP2015/072315.

Feb. 14, 2017 International Preliminary Report on Patentability issued in International Patent Application No. PCT/JP2015/072315.

* cited by examiner

ALUMINA SUBSTRATE

The present invention related to an alumina substrate on the main surface of which an aluminum nitride layer is disposed.

BACKGROUND

In the present invention, a substrate made by α-alumina ($Al_2O_3$) single crystal (hereinafter, it is called as sapphire) is called as sapphire substrate, and a substrate made by polycrystalline alumina ($Al_2O_3$) is called as polycrystalline alumina substrate. The sapphire substrate and the polycrystalline alumina substrate are both called as alumina substrate.

A crystalline layer made of a group III nitride semiconductor such as gallium nitride (GaN), aluminum nitride (AlN) or aluminum gallium nitride (AlGaN) or the like is noted as a functional layer constituting a light emitting device and a power transistor of a light emitting diode or a laser diode or the like which emit a short-wavelength light in the range of blue color to ultraviolet. Further, AlN is also a material which can be expected to be used as a heat dissipation material making use of the high thermal conductivity.

For these crystalline layers, methods are proposed where multi-layered semiconductor thin-film layers are deposited using vapor deposition methods such as molecular beam epitaxy method or metal organic chemical vapor deposition method or the like on a substrate of such as α-alumina ($Al_2O_3$) single crystal (which is called as sapphire hereinafter) or SiC single crystal or the like. Especially, a sapphire substrate is an excellent substrate material from the viewpoint of size, supplying capability and cost. However, there is some discrepancy between the lattice constants or the thermal expansion coefficients of the substrate material and the semiconductor thin-film layer because of the different constituent elements, composition ratios or crystalline constructures. Due to the discrepancy, internal stress will be produced during the forming process of the semiconductor thin-film layer. As a result, defects or deformation with high density will be introduced to bring decrease in the energy efficiency of the semiconductor element, shortening in the lifetime of the element, inferiority in the property and reduction of yield due to crack.

Thus, substrates with same materials which are excellent in lattice matching are discussed. For example, respect to the semiconductor thin-film layer of AlGaN containing large amount of Al, AlN single crystal is discussed to be used as the substrate. That is, sublimation methods on the substrates of sapphire or SiC single crystal, vapor deposition methods such as hydride vapor deposition method (HVPE) or the like, or methods in which AlN crystal is made by flux method and a semiconductor thin-film layer of AlGaN is formed on the AlN single crystal. In this case, in order to eliminate the influence of the substrate of sapphire or SiC single crystal or the like which is the base, it is desired to eliminate the sapphire or the SiC single crystal or the like by milling to obtain an independent substrate of AlN single crystal and then deposit a semiconductor thin-film layer of AlGaN on the independent substrate. In order to obtain an independent substrate, the AlN single crystal should be grown to a thickness of 100 µm or more. However, due to the growth on different substrates, internal distortions are accumulated; defects, cracks or warping are included. As a result, influence is brought to the semiconductor thin-film layer of AlGaN which is deposited on the substrate and a semiconductor thin-film layer of AlGaN cannot be formed with sufficient quality in production at last.

As the countermeasure, a method of further growing a AlN single crystal on the independent substrate is proposed. By this method, the quality is expected to be improved; but the process is too complex so that the cost is increased. Thus, there is problem that the utility value in the industry is decreased.

On the other hand, a method is proposed in which AlN single crystal is formed on the substrate of sapphire or SiC single crystal or the like after substances or voids with different properties from the AlN single crystal are sandwiched in a layer shape and/or a region shape. In such a constructure, the internal stress can be suppressed and defect, warping, crack or deformation can be decreased, or it will be easy to fabricate an independent substrate.

In Patent Document 1, a method is disclosed that a GaN or AlN single crystal is grown after a metal film containing titanium or vanadium is formed on the substrate with a moth-eaten appearance. In this way, GaN or AlN is grown from the moth-eaten part, and the stress is released in the part where the metal film is formed.

In Patent Document 2, a method is disclosed in which AlN single crystal is grown after a growth base layer of AlN and an intermediate layer of AlGaN or AlInN is formed on the substrate. In this way, after the growth of the AlN single crystal, the intermediate layer is decomposed and disappeared through a thermal treatment and result to be an independent substrate.

PATENT DOCUMENTS

Patent Document 1: JP-B-4457576
Patent Document 2: JP-B-4907127

SUMMARY

The inventors of the present invention have studied the substrate material which will be the seed crystal in order to obtain an AlN crystal with a higher quality. If the seed crystal is AlN single crystal, the constituent elements, the composition and the crystal structure are the same as the aim crystal, thus, no lattice mismatching or stress caused by thermal expansion coefficient difference will be produced. An AlN single crystal is expected to be used as the seed crystal from the viewpoint of suppressing the stress. However, if an AlN single crystal containing too much defect is used, the AlN single crystal grown on it will also become a crystal with much defect. Further, in the present point, an AlN single crystal substrate in a high quality with a φ size of 4 inches cannot be obtained cheaply and a collected quantity cannot be provided stably.

On the other hand, for example, sapphire substrate is a substrate which is excellent in quality, size, cost and supplying capability, but it is a different substance from AlN, so if an AlN layer is formed on the sapphire substrate, lattice mismatching and warping caused by thermal expansion coefficient difference will be produced. Such a warping cannot be avoided as long as the substrate and the formed layer are different. In Patent documents 1 and 2, at least the warping of the substrate is decreased by a process of sandwiching substances or voids with different properties from the AlN single crystal in a layer shape and/or a region shape. However, there still problems which should be solved in these methods.

Patent Document 1 is characterised by the growth of AlN single crystals from the places where no metal film containing titanium or vanadium is formed. However, the substrate which will be the base turns to be a substance with different composition or crystal structure from AlN single crystal; thus, it is difficult to decrease the warping caused by lattice mismatching.

In Patent Document 2, an independent substrate can be obtained by decomposition of the intermediate layer, however, warping cannot be decreased because it is a process after the AlN crystal growth.

The aim of the present invention is to provide an alumina substrate formed with an AlN layer with decreased warping. Further, it aims to provide an alumina substrate which can take out the grown AlN crystal during the growing of the AlN crystal by spontaneous peeling as an independent crystal.

The present invention is made to solve the above technical problem. It is an alumina substrate characterized in that an AlN layer is formed on the surface of the alumina substrate and a rare earth elements-containing layer and/or rare earth elements-containing regions is/are formed in the interior of the AlN layer or the interface between the AlN layer and the alumina substrate. Internal stress and deformation caused by lattice mismatching will be concentrated in a rare earth elements-containing layer and/or rare earth elements-containing regions by forming a rare earth elements-containing layer and/or rare earth elements-containing regions and thus the internal stress and deformation in the AlN layer can be decreased. Thus, the warping of the alumina substrate of the present invention can be decreased. Further, there is an effect that when AlN crystal is grown on the substrate of the present invention, it can be peeled inside the substrate of the present invention during the fabricating of the crystal or during the cooling process and it is easy to become an independent substrate.

As a preferable embodiment of the present invention, it is preferred that the the content of the rare earth elements is 1~10000 ppm in a ratio to the Al element. Thereby, the concentration of the stress in the rare earth elements-containing layer and/or the rare earth elements-containing regions and the decreasing effect of the warping caused by concentration of the stress can be arisen more obviously.

As a preferable embodiment of the present invention, the thickness of the AlN layer is preferred to be 0.02 μm to 100 μm. Thereby, the decreasing effect of the warping can be arisen more obviously. Further, when excessive stress is applied during the grain growth process of AlN or the like on the alumina substrate of the present invention, spontaneous peeling will be invited inside the alumina substrate of the present invention, and crack or fracture can be prevented from occurring in the grown grains.

As a preferable embodiment of the present invention, the alumina substrate is preferred to be sapphire. Thereby, a substrate material can be provided which is useful for a device where a semiconductor layer is laminated on a single crystal substrate, wherein, the device is a light emitting device or a power transistor.

As a preferable embodiment of the present invention, the AlN layer is preferred to be mainly composed of single crystal. Thereby, the cost can be reduced for producing a device where a semiconductor layer is laminated on a single crystal substrate, wherein, the device is a light emitting device or a power transistor.

According to the present invention, an alumina substrate formed with an AlN layer with decreased warping can be provided.

Further, by using the alumina substrate of the present invention to grow an AlN crystal or the like, the grown AlN crystal or the like can be peeled spontaneously to be taken out as an independent crystal.

DETAILED DESCRIPTION OF EMBODIMENTS

The present embodiment is characterized by the structure in which a rare earth elements-containing layer and/or rare earth elements-containing regions is/are disposed in the interface formed between an AlN layer and alumina substrate surface. The structure is described using FIG. 1 and FIG. 2.

In the present embodiment, rare earth elements refer to Y and elements of the lanthanide group. These elements have an ionic radius much bigger than Al, thus, the effect will be high when they are used as the elements in the layer and/or regions for concentrating the tension stress which will be mentioned below. Further, these elements have a character that they can form the structure of the present embodiment more easily. The rare earth elements are not restricted to be one kind. Several kinds of rare earth elements can be used at the same time.

Figure 1A:
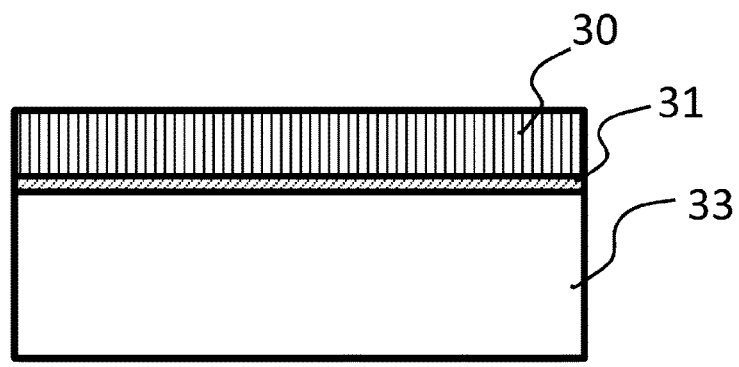
FIG. 1a is a schematic diagram showing the cross-section of an example of an alumina substrate of the present embodiment, wherein, a rare earth elements-containing layer is sandwiched by the interface between the alumina substrate and the AlN layer.
Figure 1B:
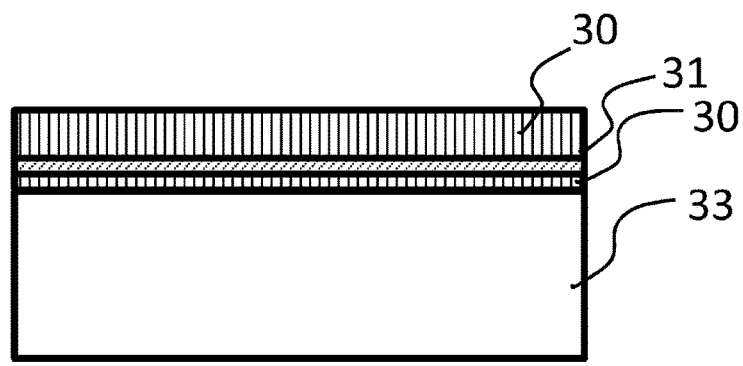
FIG. 1b is a schematic diagram showing the cross-section of another example of an alumina substrate of the present embodiment, wherein, a rare earth elements-containing layer is formed inside the AlN layers.

FIG. 1 shows a structure in which a rare earth elements-containing layer 31 is dispose in a layer shape. FIG. 1a shows an example in which a rare earth elements-containing layer 31 is disposed in the interface between alumina substrate 33 which has not been nitridized and AlN layer 30 which is formed on the alumina substrate. FIG. 1b shows an example in which rare earth elements-containing layer 31 is disposed inside AlN layers 30. According to such a structure, stress will be concentrated in rare earth elements-containing layer 31 due to the lattice mismatching of alumina substrate 33 and AlN layer 30 and the difference of the thermal expansion coefficients. Just by the concentrated stress, the stress applied to AlN layer 30 situated in the side closer to the surface than the rare earth elements-containing layer can be reduced. At the same time, the deformation, defect, warping, crack and fracture in AlN layer 30 can be decreased. Further, rare earth elements are substances with a high melting point, thus, they are substances which can bear the AlN crystal growth in a higher temperature.

On the other hand, when the alumina substrate of the present embodiment is used as a seed crystal to grow the AlN crystal, stress caused by lattice mismatching of the alumina substrate and AlN crystal and the difference of the thermal expansion coefficients will be further increased. However, the stress will be concentrated most in rare earth elements-containing layer 31. Thereby, the stress introduced into the AlN layer situated in the side closer to the substrate surface than rare earth elements-containing layer 31 and the AlN crystal grown with the AlN layer as the seed will be alleviated just by the concentrated stress in rare earth elements-containing layer 31. Further, when more excessive stress is accumulated, peeling will happen in the place where the stress mostly concentrated, wherein, the place is rare earth elements-containing layer 31. Thus, the AlN crystal turns to be independent.

The reason for the concentration of the stress in rare earth elements-containing layer 31 will be described hereinafter. Generally speaking, when two substances with different lattice spacing are combined, stress will be produced because of the lattice mismatching. Further, when the thermal expansion coefficients are different even if their lattice spacing are the same, the lattice spacing will be different due to the temperature fluctuation, thus, lattice mismatching will still be happened to produce stress. Compared to the alumina substrate, AlN crystal can obtain larger lattice spacing, and the rare earth elements-containing layer will obtain much larger lattice spacing. Thus, when rare earth elements-containing layer 31 is sandwiched between alumina substrate 33 and AlN layer 30 as shown in FIG. 1a, stress will be produced in rare earth elements-containing layer 31 nearby the interface formed between alumina substrate 33 and rare earth elements-containing layer 31. Further, stress will also be produced nearby the interface of rare earth elements-containing layer 31 and AlN layer 30. That is, two kinds of stress are produced in rare earth elements-containing layer 31, thus the stress applied on rare earth elements-containing layer 31 is larger than the stress produced in AlN layer 30 in the case when only AlN layer 30 is formed on alumina substrate 33. The stress obtained from alumina substrate 33 will be offset just as much as the surplus stress produced in rare earth elements-containing layer 31, and the warping of AlN layer 30 will be decreased.

It will also be the same when a rare earth elements-containing layer joins to alumina substrate 33 not directly but through an AlN layer as shown in FIG. 1b. However, it will become a structure in which the stress due to the combination with the alumina substrate will be alleviated by the stress produced through the AlN layer.

Figure 2A:
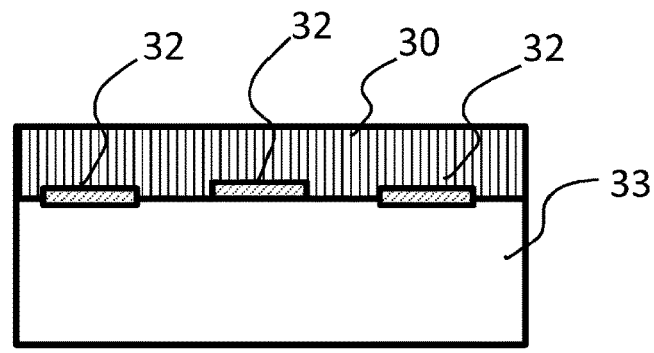
FIG. 2a is a schematic diagram showing the cross-section of an example of an alumina substrate of the present embodiment, wherein, rare earth elements-containing regions are scattered in the interface between the alumina substrate and the AlN layer.
Figure 2B:
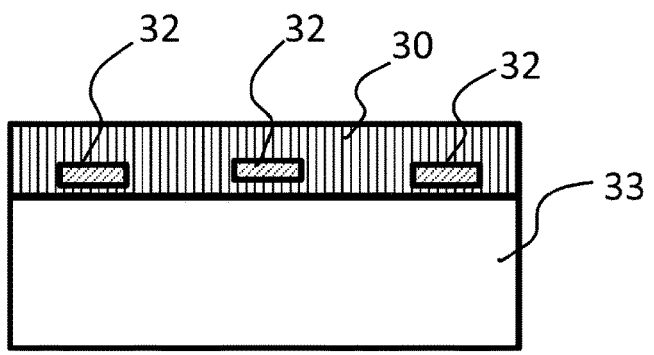
FIG. 2b is a schematic diagram showing the cross-section of an example of an alumina substrate of the present embodiment, wherein, rare earth elements-containing regions are scattered inside the AlN layers.
Figure 2C:
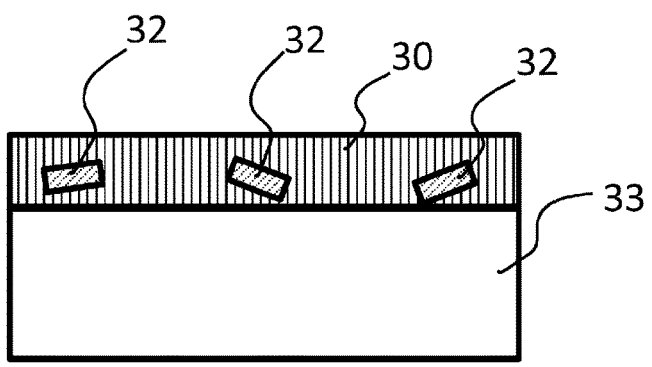
FIG. 2c is a schematic diagram showing the cross-section of another example of an alumina substrate of the present embodiment, wherein, rare earth elements-containing regions are scattered inside the AlN layers leaning from the direction parallel to the substrate surface.

It will also be the same when the place containing rare earth elements is a region shape instead of being a layer shape. In the present embodiment, the case where rare earth elements are distributed approximately parallel to the substrate surface and continuously is called as a rare earth elements-containing layer, and the case where the rare earth elements are distributed discontinuously is called as a rare earth elements-containing region. Further, it is not necessary that rare earth elements-containing regions are approximately parallel relative to the substrate surface. FIG. 2 is a schematic diagram showing the disposition of the rare earth elements-containing regions. FIG. 2a shows a structure in which rare earth elements-containing regions 32 are disposed to contact the interface of the alumina substrate. FIG. 2b shows a structure in which rare earth elements-containing regions 32 are disposed to be surrounded by AlN layers without contacting the interface of the alumina substrate. And FIG. 2c shows a structure in which rare earth elements-containing regions 32 are disposed to be tilted relative to the AlN layer surface. Both cases can be deemed as the same with the above case of the rare earth elements-containing layer. That is, the stress is concentrated in the rare earth elements-containing regions 32, and as the result, it can offset the stress produced by the interaction with alumina substrate 33. Therefore, the warping of the part disposed closer to the surface than rare earth elements-containing regions 32 in AlN layer 30 can be reduced.

When AlN crystal is grown with the alumina substrate of the present embodiment as the seed crystal, the stress caused by lattice mismatching of alumina substrate 33 and AlN crystal will increase along with the growth of the AlN crystal and cracks will be generated if excessive stress is accumulated. At this time, cracks will start from rare earth elements-containing layer 31 and/or regions 32 where stress is concentrated and will further spread along rare earth elements-containing layer 31 and/or regions 32. By distributing rare earth elements-containing layer 31 and/or regions 32 in the direction approximately parallel to the substrate surface, crack will not go towards the grown AlN crystal and the AlN crystal can be spontaneously peeled and turn to be independent.

In the alumina substrate of the present embodiment, the surface layer is an AlN layer. Thus, an AlN crystal can be grown under a high temperature. As long as it is grown at least under a temperature below 1750° C., AlN single crystal can be grown through a liquid phase method such as flux method, because none of alumina substrate 33, rare earth elements-containing layer 31 and/or regions 32 and AlN layer 30 is decomposed, wherein, alumina substrate 33 is the construction substance of the alumina substrate of the present embodiment. Further, even if it is grown under a high temperature over 2000° C. like in the sublimation method, at least AlN layer 30 which is the surface layer will not decompose, thus, AlN single crystal can also be grown.

Rare earth elements-containing layer 31 can be any form such as a single layer or multiple layers. If it is a single layer, the stress concentration in rare earth elements-containing layer 31 can work more powerfully and thus a spontaneous peeling will become easy. If it is in a form of multiple layers, the stress concentration in each layer will be alleviated. However, the propagation direction of the crack will be limited strongly; thus, the propagation of the crack toward the grown AlN crystal can be prevented more effectively.

The shape of rare earth elements-containing regions 32 is not limited, and it is preferred to be a shape longer in the direction parallel to the substrate surface than in the direction perpendicular to the substrate surface. It is because that in this way the stress concentration will be notable. Further, FIG. 2 shows rare earth elements-containing regions in a rectangular shape, but the regions are not limited to be in a rectangular shape. They can be in an ellipsoid shape or indefinite shape or other shape. Further, It can also work even if rare earth elements-containing regions 32 having a disposition as shown in FIG. 2a, FIG. 2b and FIG. 2c are mixed, or it turns to be a structure of a combination with rare earth elements-containing layer 31.

The rare earth elements-containing layer 31 and the rare earth elements-containing regions 32 are preferred to be distributed in a direction approximately parallel to the substrate surface. It is because that while the AlN crystal is grown and turn to be independent through spontaneous peeling, the propagation direction of the crack will be induced to be the parallel direction relative to the substrate surface, and the crack propagation toward the AlN crystal during spontaneous peeling can be prevented. Further, the approximately parallel direction refers to a parallel direction that height difference range the crack propagation toward to the grown AlN crystal can be prevented is in an allowable level.

The substrate which constructs the base is an alumina substrate, i.e., a sapphire substrate or a polycrystallinge alumina substrate.

The amount of the contained rare earth elements is 1 ppm or more and 10000 ppm or less in the ratio with Al elements, and more preferably 1 ppm or more and 1000 ppm or less. Thereby, the concentration of the stress in the rare earth elements-containing layer and/or the rare earth elements-containing regions and the warping caused by the stress can be reduced.

The layer thickness of the AlN layer is 0.02 μm or more and 100 μm or less, and preferably 0.05 μm or more and 10 μm or less, and more preferably 0.05 μm or more and 1 μm or less. Thereby, the warping can be reduced. Further, when excessive stress is applied during the grain growth of AlN or the like on the alumina substrate of the present invention, spontaneous peeling will happen inside the alumina substrate of present invention, and the crack or the fracture in the grown crystal can be prevented from occurring.

When sapphire substrate is used, the formed AlN layer is required to be mainly composed of single crystals. In fact, it is preferred that 50% or more of the total area of the substrate turns to be single crystal, wherein, the substrate is the base. Thereby, the cost can be reduced for the fabrication of the devices such as a light emitting device or a power transistor or the like where a semiconductor layer is laminated on a single crystal substrate.

Hereinafter, an example for fabricating an alumina substrate of the present embodiment is described. Also, an alumina substrate having the structure of the present embodiment can be fabricated by another method.

Figure 3:
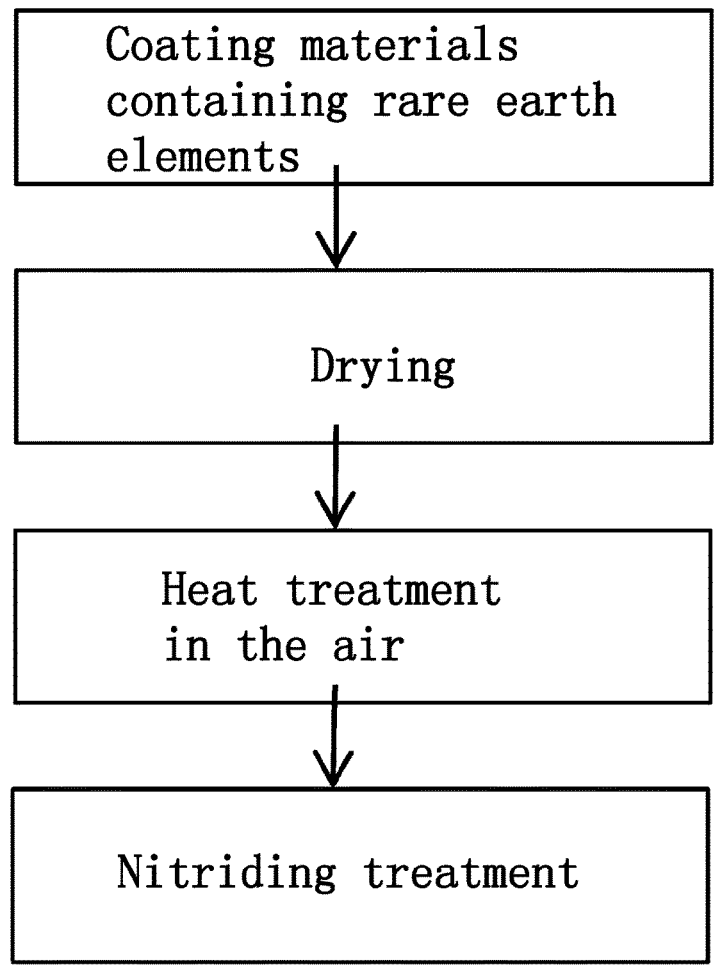
FIG. 3 is an example of a flow chart for fabricating an alumina substrate of the present embodiment.

FIG. 3 give a demonstration for the fabrication flow. As the main process, it is composed of the following a) to d), i.e., a) a process of coating materials containing rare earth elements on the alumina substrate which will be the base; b) drying process; c) a process of heat treatment for the coated substrate in the air; and d) nitriding treatment process. Further, these processes can be repeated.

First, the raw materials containing the rare earth elements are coated on the alumina substrate. It can be performed by spin-coating method which can coat easily. But it is not limited to this method. It can also be performed by spray method, vapor deposition method or sputtering method or the like. Further, the nitriding treatment process described later can be performed in an atmosphere containing rare earth elements.

In the spin-coating method, a solution of raw materials is required. Thus, the ethanol solution of nitrate of rare earth elements and MOD solution of rare earth elements prepared by Kojundo Chemical Laboratory Co., Ltd. were used. MOD solution is a solution where organic salts of the rare earth elementsrare earth elements are dissolved in a solution with xylene as the main component. The solution has a high volatility, thus, it can prevent the reaggregation of the solution after coating. The ethanol solution of nitrate of rare earth elements or the MOD solution of rare earth elements is spin-coated on an alumina substrate rotated with a speed of 1000 to 3000 rpm for 20 to 120 minutes to form a coating layer. Aqueous solution can be used from the viewpoint of the reaggregation. If the vapor deposition method or the sputtering method is used, raw materials of rare earth elements in forms of oxides or metal can be used.

When salts are used as the raw materials, they are preferably heat treated in air in order to oxidize the rare earth elements. By such a heat treatment, mixing of other anions can be prevented. The temperature for heat treatment is different according to the salts; however, it is preferred to be 500° C. to 1400° C., and more preferably to be 600° C. to 1000° C. In such a temperature range, the smoothness of the substrate surface can be maintained, and the coated solution can be heat-decomposed completely. And further, the raw materials can be prepared to be rare earth elements oxides even if they are inorganic salts or organic salts.

Figure 4:
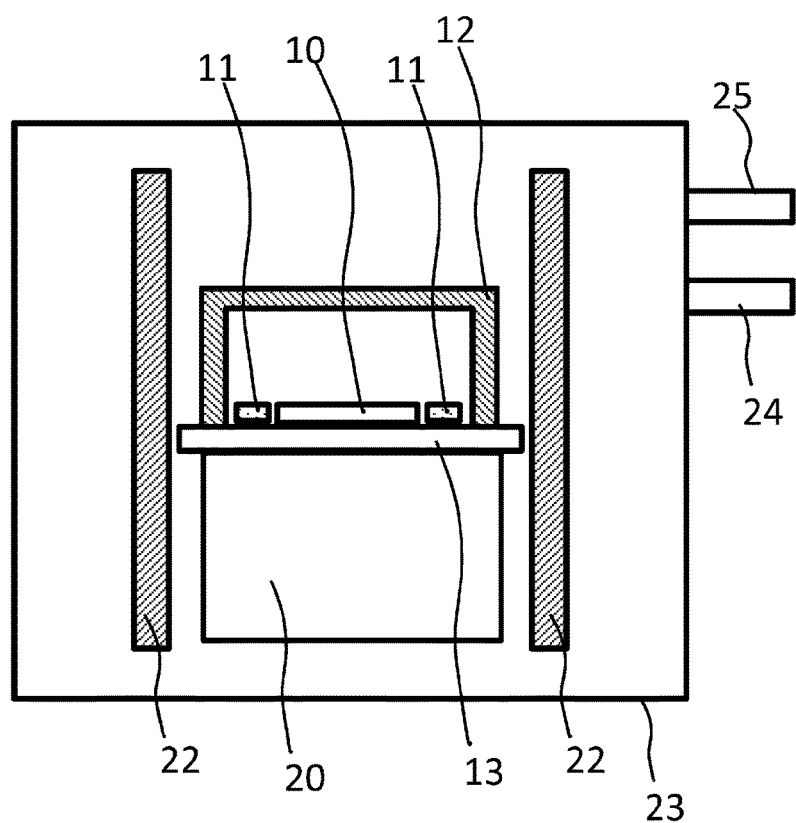
FIG. 4 is a schematic diagram showing the heating part during the nitriding process.

The nitriding treatment is performed by heating the alumina substrate or the sapphire substrate whose surface was coated by rare earth elementsrare earth elements in nitrogen. It is described using FIG. 4. FIG. 4 is a schematic diagram showing the heating part. The heating furnace is composed of carbon heater 22, sampling stage 20 and chamber 23 which covers the whole. In chamber 23, gas exhaust port 24 and gas intake port 25 are disposed. Gas exhaust port 24 is connected with a rotary pump (which is not shown in the figure) and a diffusion pump (which is not shown in the figure) and turns out to be a structure which can perform degassing. Further, through gas intake port 25 it turns out to be a structure which can introduce nitrogen gas.

Alumina plate 13 is disposed on the sampling stage, nitrided substrate 10 and carbons 11 are loaded on it. Further, at the same time, approximately hermetically-closed saggar 12 is disposed on alumina plate 13 to cover the whole of nitriding treatment substrate 10 and carbon 11. Besides, the approximately hermetically-closed state doesn't refer to a sealing property which can block the gas flow entirely, but refers to a sealing property which can suppress the gas flow to some extent. Further, in the case where raw materials containing rare earth elements are disposed during the nitriding treatment process, they are disposed to be covered by an approximately hermetically-closed saggar like carbon 11. Further, in the case when raw materials containing rare earth elements or carbon are disposed to the holding jigs, it can be coated on alumina plate 13 or in the inner side of approximately hermetically-closed saggar 12.

The heating temperature can be different according to the rare earth elementsrare earth elements, and is about 1400 to 1800° C. If it is lower than this temperature, the AlN layer cannot be formed sufficiently. On the other hand, if the heating temperature is too high, as the processed substrate, alumina substrate will be deteriorated. Further, carbon is disposed beside the substrate. The amount of carbon would be different according to the processed size and the processed condition, thus, it is not limited and is 0.1 mg or more. If it is too little, the nitriding treatment cannot be performed sufficiently and no or little AlN can be produced. Further, the crystallinity may also be decreased. If it is more than 0.1 mg, the excessive carbon can not turn to be gas and maintained to be the original state; thus, no influence will be brought to the producing of AlN. However, sometimes, the flatness of the substrate surface is decreased or different phase is precipitated, thus, the amount of carbon need to be adjusted according to the acceptable level.

Figure 5:
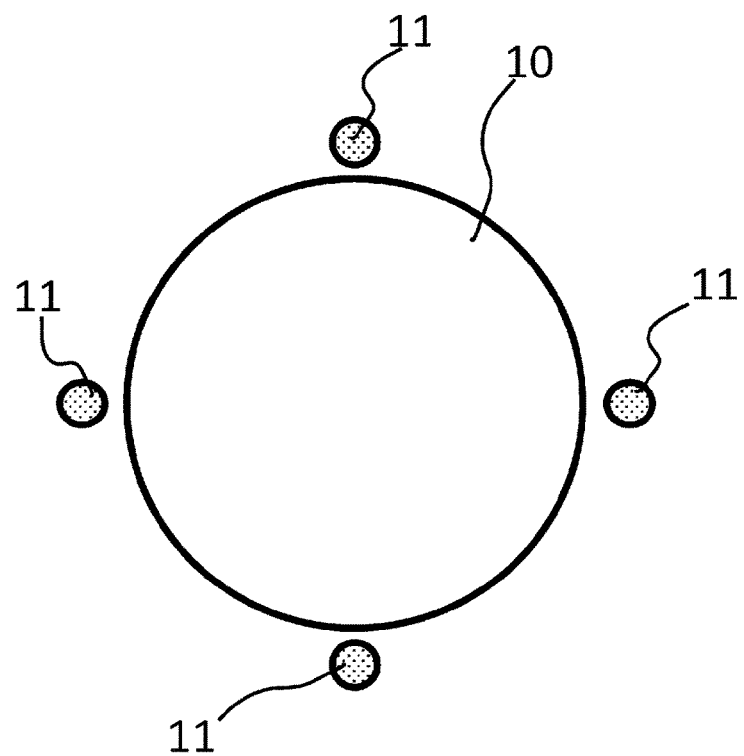
FIG. 5 is a schematic diagram showing the relationship of the nitride substrate in Example 1 and the powder carbon.

The disposing method of the carbon and the form of the carbon are not limited. FIG. 5 shows an example of the disposing method. Carbon 11 is equally disposed in four places around nitriding treatment substrate 10 with a φ size of 2 inches. The carbon can be disposed in one place together, and can also be coated on a holder of a saggar or the like. In addition, a carbon with a block shape or a rod shape can be disposed.

According to such a treatment, an AlN layer can be formed on the alumina substrate surface. In the case of a sapphire substrate, the formed AlN layer is formed follow the substrate orientation of the foundation. Further, AlN will be generated on the substrate surface even if no Al is contained in the coating raw material. Thus, the AlN is not formed to adhere to the alumina substrate surface but is formed by substituting the oxygen in the alumina substrate nearby the surface with nitrogen. On the other hand, the rare earth elements coated on the substrate surface will mostly disappear through a nitriding treatment. It is thought that they form nitrides or carbides and turn to be gas to disappear.

An alumina substrate with an AlN layer formed on it without forming a rare earth elements-containing layer and/or rare earth elements-containing regions can also be fabricated by turning the entire coated rare earth elements to gas to remove them. The inventors of the present invention considers to left a part of rare earth elements as a layer and/or regions and thus the stress caused by lattice mismatching will be concentrated there. Therefore, they try to remain a part of rare earth elements intentionally. As the result of trials and errors, it is found that the residual amount can be controlled by controlling the thickness and density of the coated layer of the rare earth elements-containing substance, the heat treatment temperature, the nitriding treatment temperature, the duration and the atmosphere, and also the carbon amount. As a result, the present invention is completed.

In the present embodiment, the atmosphere is maintained by the hermetically-closed heating furnace and the approximately hermetically-closed saggar, but it is not limited to like this. It is considered that as long as the carbon amount and the rare earth elements amount can be controlled, a substrate formed with an AlN layer and a rare earth elements-containing layer and/or rare earth elements-containing regions can be obtained even if the heating part is in a gas flow or in an open environment.

Figure 6A:
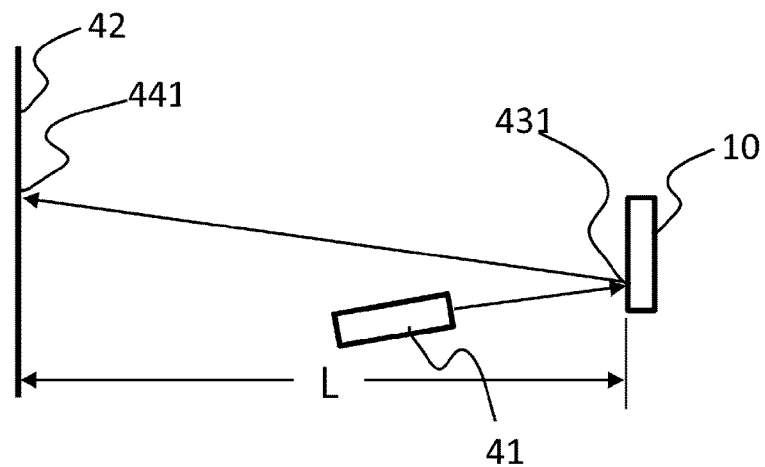
FIG. 6a is a schematic diagram showing the first measuring system which will be the reference in the measuring method for the curvature radius of the alumina substrate in the present embodiment.
Figure 6B:
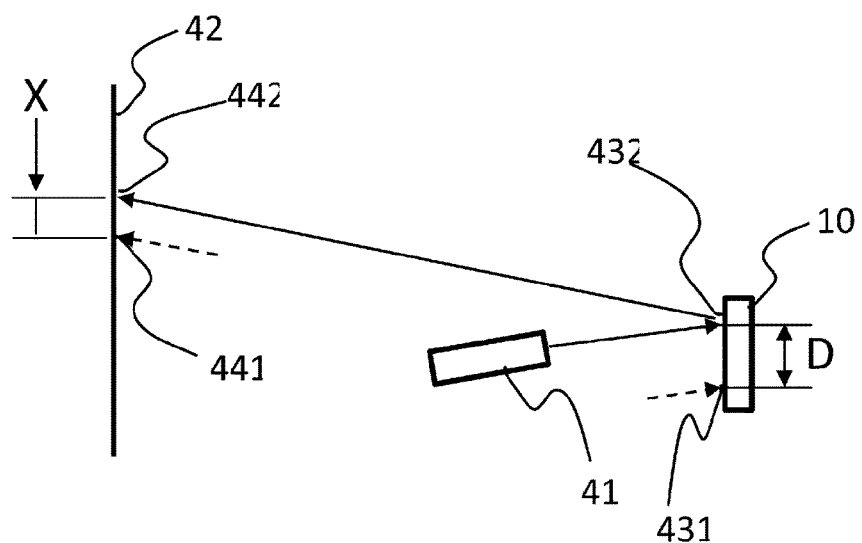
FIG. 6b is a schematic diagram showing the optical measuring system after the moving of the irradiation position in the measuring method for the curvature radius of the alumina substrate in the present embodiment.

The warping can be evaluated by calculating the curvature radius through a method using the surface reflected light. It is described using FIG. 6. Light is irradiated from visible LD or LED light source 41 to an arbitrary point 431 on the side formed with AlN layer of alumina substrate 10 of the present embodiment. The reflected light forms an image on screen 42 and the image position 441 is marked. Subsequently, (as shown in FIG. 6a) the alumina substrate is moved only with a distance D in a direction parallel to the screen in a state with the optical system fixed, the irradiation position is changed to position 432. In the same way, the reflected light from the irradiation position 432 forms an image on the screen and the image position 442 is marked. The distance of the two positions formed with images 441 and 442 is deemed as the displacement X (as shown in FIG. 6b). Further, the distance of alumina substrate 10 and screen 42 is set as L; the curvature radius of the warping of alumina substrate 10 is set as R. If the L and R are sufficiently larger than the D and X, curvature radius R can be approximately calculated by the following formula.

$$R = 2LD/X$$

Further, if the displacement vector of irradiation position 432 with irradiation position 431 being the start point and the displacement vector of image position 442 with image position 441 being the start point are parallel, the warping of alumina substrate 10 is convex. If they are antiparallel, the warping of alumina substrate 10 is concavity.

EXAMPLES

Example 1

MOD solution was coated on c-plane sapphire substrate with a φ size of 2 inches by spin coating method under 2000 rpm for 20 seconds, wherein, the MOD solution contained Y as the rare element with a concentration of 2 wt %. After coated, the substrate was dried on a hotplate of 150° C. for 10 minutes. Then it was heat treated in air for 2 hours under 600° C. After the heat treatment, the substrate was put on alumina plate 13 with 100 mm square. Further, powder carbon 11 was disposed in four places around substrate 10 with 20 mg in each place and a total amount of 80 mg as shown in FIG. 5. As shown in FIG. 4, alumina saggar 12 with 75 mm square and a height of 30 mm covered them all. They were then set on sampling stage 20. The nitriding furnace is an electric furnace of resistance heating type with carbon as the heater. Before heating, degassing was performed using a rotary pump and a diffusion pump to 0.03 Pa, and then nitrogen gas was flowed into the saggar to obtain a pressure of 100 kPa (atmospheric pressure) and after that the flow of nitrogen gas is stopped. The treating temperature of the nitriding treatment was 1750° C., the treating time was set to be 4 hours, and the heating and cooling rate were set as 600° C./h. After cooled to the room temperature, the treated substrate was taken out to evaluate. The treated substrate was mostly transparent. But it was confirmed the inside region about 1 mm from the outer circumferential part became clouded. Further, if it was observed using a microscope, places formed with hillock was also discovered in the transparent part.

A 10 mm square sample cut out from the vicinity of the center part was used to perform a XRD measurement using Cu as the target. The result confirmed the AlN (002) diffraction ray and thus it could be confirmed as a single crystal or an alignment film along the c axis. On the other hand, crystal phase containing Y cannot been found. Further, the intensity ratio of the AlN (002) diffraction ray relative to the sapphire (006) diffraction ray was 52%. Six peaks of six-fold symmetry axis were found in the pole figure measurement using (112) plane and thus it could be confirmed to be a single crystal.

Figure 7A:
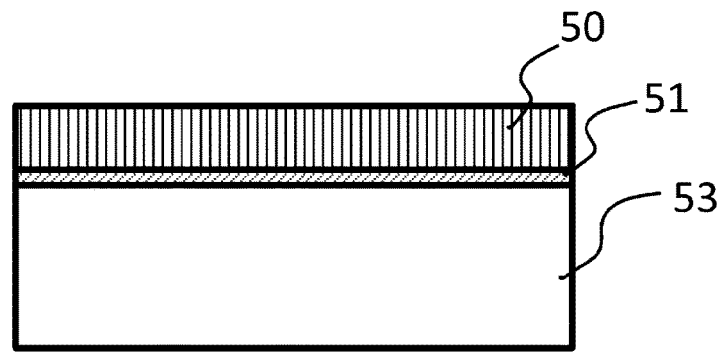
FIG. 7a is a schematic diagram showing the appearance of the cross-section processed by FIB observed by backscattered electron SEM in Example 1.

The curvature radius was measured using an optical system as shown in FIG. 6 and the curvature radius was 69 m. The surface of the side forming an AlN layer was convex. Further, the amount of the rare earth element was analyzed using X-ray fluorescence method from the surface side formed with AlN layer, as the result, 110 ppm of Y atoms relative to the Al atom number was detected. Subsequently, the cross-section near the center part was processed by FIB and then observed by backscattered electron SEM. The embodiment was schematicly shown in FIG. 7a. In the result, white-light-emitting layer 51 with a thickness of about 0.02 μm was observed to be sandwiched by first crystal 50 with a thickness of 0.3 μm and second crystal 53. From the result of XRD, it was discovered that first crystal 50 was AlN crystal. Further, it could be confirmed that white-light-emitting layer 51 contained elements with larger atomic weight than Al element from the property of the backscattered electron image. If the elements used in the treating process were taken into consideration, the element with larger atomic weight than Al element was considered to be Y. Further, it was confirmed to be Y by EPMA. In addition, the elements in first crystal 50 and second crystal 53 were also be analyzed by EPMA; and first crystal 50 was confirmed to be AlN layer; and second crystal 53 was confirmed to be alumina respectively.

Example 2

In the 10 mm square samples cut out from Example 1, a sample in the vicinity of the outer circumferential part was performed with XRD measurement, curvature radius measurement, X-ray fluorescence method and SEM observation in the same way as in Example 1. In the XRD measurement, the result was the same as in Example 1. An AlN (002) diffraction ray was observed and the intensity ratio of AlN (002) diffraction ray relative to sapphire (006) diffraction ray was 48%. Six peaks of six-fold symmetry axis were found in the pole figure measurement using (112) plane and thus the sample could be confirmed to be a single crystal. However in the region where cloud was found in the vicinity of the outer circumferential part, AlN (101) also appeared in addition to the AlN (002). It turned to be a bowl shape instead of a single crystal. The curvature radius was 120 m. Further, in the X-ray fluorescence method, 180 ppm of Y atoms relative to the Al atom number was detected. If compared to Example 1, it was found that if the content of rare earth elements was increased, the curvature radius would be bigger, i.e., the warping would be smaller.

Figure 7B:
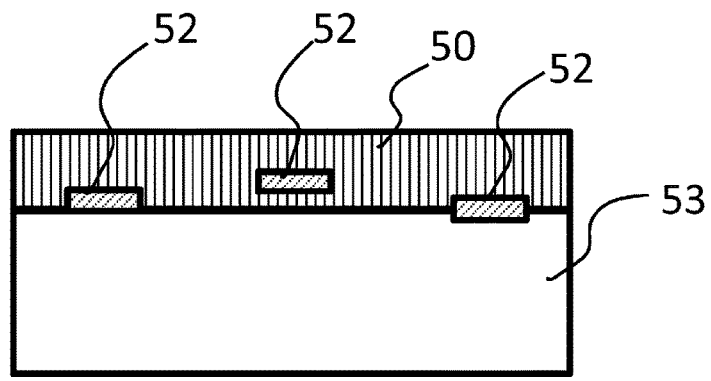
FIG. 7b is a schematic diagram showing the appearance of the cross-section processed by FIB observed by backscattered electron SEM in Example 2.

The observed result from the backscattered electron SEM was schematicly shown in FIG. 7b. In the result, white-light-emitting regions 52 were observed to be captured by first crystal 50. It was confirmed that Y was contained by the same assumption as Example 1. White-light-emitting regions 52 were confirmed to be not in consecutive layer shape, but were locally independent regions. Further, white-light-emitting regions 52 could be broadly divided into one kind which was formed with a part or the whole of the bottom of the region contacted with the interface between second crystal 53 and first crystal 50 and another kind which was surrounded by first crystal 50. The thickness of first crystal 50 was 0.35 μm and the largest thickness of white-light-emitting regions 52 was about 0.04 μm. In addition, the elements in first crystal 50 and second crystal 53 were analyzed by EPMA; and first crystal 50 was confirmed to be AlN layer; and second crystal 53 was confirmed to be alumina respectively.

Example 3

The c-plane sapphire was cut into 10 mm square to prepare substrate 10 for nitriding treatment. Neodymium (III) nitrate hydrate was dissolved in ethanol to obtain a concentration of 2 wt %. After that, some surfactant was added to fabricate a coating solution. The spin coating was performed under 3000 rpm for 20 seconds. After dried on a hotplate of 250° C. for 10 minutes, the sample was performed with a heat treatment in air for 2 hours under 800° C. The nitriding treatment was performed in the same way as Example 1. However, the treating temperature was 1750° C.

In the XRD measurement, AlN (002) diffraction ray was observed and the intensity ratio of AlN (002) diffraction ray relative to sapphire (006) diffraction ray was 15%. According to the observation of backscattered electron SEM for the cross-section processed by FIB, the thickness of first crystal 50 was 0.15 μm and the thickness of white-light-emitting layer 51 was about 0.02 μm. The Nd was 100 ppm in the atomic ratio relative to Al and the curvature radius was 74 m.

Comparative Example 1

Same treatment was performed in the same way as Example 3 except that the nitriding treatment duration was set as 12 hours and a cylindrical alumina crucible with a diameter of 60 mm and a height of 50 mm was used as alumina saggar 12. The result turn out to be that the intensity ratio of the AlN (002) diffraction ray relative to the sapphire (006) diffraction ray was 18% and the thickness of first crystal 50 was 0.17 μm which was almost the same as Example 3. On the other hand, the curvature radius was 15 m and no Nd could be detected. From the comparison of Example 3 and Comparative example 1, it was known that the curvature radius of the alumina substrate in the present embodiment would be larger, i.e., the warping would be smaller by containing rare earth elements.

Example 4

The c-plane sapphire was cut into 10 mm square to prepare substrate 10 for nitriding treatment. An MOD solution containing Eu with a concentration of 2 wt % as the rare element was coated by spin coating method under 2000 rpm for 20 seconds. After coated, the substrate was dried on a hotplate of 150° C. for 10 minutes. Then it was heat treated in air for 2 hours under 600° C. The nitriding treatment was performed in the same way as Example 3. But the treating temperature was 1650° C.

In the XRD measurement, an AlN (002) diffraction ray was discovered, and the intensity ratio of AlN (002) diffraction ray relative to sapphire (006) diffraction ray was 32%. According to the observation of SEM for the cross-section processed by FIB, the thickness of first crystal 50 was 0.25 μm and the thickness of white-light-emitting layer 51 was about 0.02 μm. The curvature radius was 30 m and the Eu was 35 ppm in the atomic ratio relative to Al.

Example 5

A polycrystalline alumina substrate was cut into 10 mm square to prepare substrate 10 for nitriding treatment. Coating, drying, heat treatment in air and nitriding treatment were performed in the same way as Example 4. However, the nitriding treatment temperature was set as 1550° C.

In the XRD measurement, in addition to the diffraction rays generated by alumina, AlN(100) and AlN (002) diffraction ray were observed. The thickness of first crystal 50 was 0.05 μm, and 10 ppm of Eu in the atomic ratio relative to Al was detected.

Example 6

One of 10 mm square samples cut from the vicinity of the center part in Example 1 was used as the substrate to grow AlN single crystal by a flux method. The flux method was performed by the following method. Materials (with a composition as follows, i.e., Si: 35.7 wt %, C: 2.3 wt %, Al: 62.0 wt %, weight: 150 g) were added into a crucible made from yttria-stabilized zirconia and then the crucible was put into the heating region of a high-frequency heating furnace. A stirring jig made from yttria-stabilized zirconia was disposed just above the material, wherein, a nitrided sapphire substrate was fixed on the stirring jig. The temperature of the materials in the nitrogen atmosphere was heated to 1600° C. to melt the materials. Then the solution was saturated with nitrogen while stirred by impellers for 5 hours. After that, the nitrided sapphire substrate was contacted to the surface of the solution and rotated under 100 rpm. At the same time, the temperature of the materials was decreased slowly to grow an AlN single crystal on the sapphire substrate using 20 hours. After the grain growth was completed, the sapphire substrate was kept away from the solution and the materials were cooled to the room temperature. After being cooled, the sample was taken out from the furnace. It was found that the alumina substrate was peeled in the horizontal direction and the AlN single crystal plate was separated from the part of the sapphire substrate. It was considered that in the growth of the AlN crystal, the rare earth elements-containing layer withstood the concentrated stress generated by lattice mismatching and as the result it was peeled spontaneously. The thickness of the AlN single crystal plate was 250 µm.

The alumina substrate of the present embodiment not only can be used as the substrate for growing single crystals such as AlN or the like, but also can be used in the substrate for light emitting element and semiconductor element, or substrate of the products in the field which using the high thermal conductivity of AlN.

Further, the alumina substrate of the present embodiment itself can also be used directly as long as the utility value in industry was not damaged. That is, as long as the amount of the contained rare earth elements is in the allowed range, the alumina substrate can also be used as a high thermal conductivity substrate, a substrate for surface acoustic wave or a piezoelectric substrate.

DESCRIPTION OF REFERENCE NUMERALS 10 nitrided substrate
11 carbon
12 alumina saggar
13 alumina plate
20 sampling stage
22 carbon heater
23 chamber
24 gas exhaust port
25 gas intake port
30 AlN layer
31 rare earth elements-containing layer
32 rare earth elements-containing region
33 alumina substrate
41 visible LD or LED light source
42 screen
431 the irradiation position of the light in an arbitrary point on the side formed with AlN layer of alumina substrate 10 of the present embodiment
432 the irradiation position of the light after the alumina substrate 10 of the present embodiment is moved parallel to screen 42
441 the image position of the reflected light imaged on the screen corresponding to the irradiation position 431 of the light
442 the image position of the reflected light imaged on the screen corresponding to the irradiation position 432 of the light
50 first crystal
51 white-light-emitting layer
52 white-light-emitting region
53 second crystal

What is claimed is:

1. An alumina substrate wherein an AlN layer is formed on a surface of the alumina substrate and a rare earth elements-containing layer and/or rare earth elements-containing regions is/are formed in the interior of the AlN layer and in an area closer to the surface of the alumina substrate than to an outer surface of the AlN layer, or in the interface between the AlN layer and the alumina substrate.

2. The alumina substrate of claim 1, wherein,
   the content of the rare earth elements is 1~10000 ppm in the ratio relative to Al element.

3. The alumina substrate of claim 1, wherein,
   the thickness of the AlN layer is 0.02 µm to 100 µm.

4. The alumina substrate of claim 1, wherein,
   the alumina substrate is sapphire.

5. The alumina substrate of claim 4, wherein,
   the AlN layer is mainly composed of single crystals.

6. The alumina substrate of claim 2, wherein,
   the thickness of the AlN layer is 0.02 µm to 100 µm.

7. The alumina substrate of claim 2, wherein,
   the alumina substrate is sapphire.

8. The alumina substrate of claim 3, wherein,
   the alumina substrate is sapphire.

9. The alumina substrate of claim 6, wherein,
   the alumina substrate is sapphire.

10. The alumina substrate of claim 7, wherein,
    the AlN layer is mainly composed of single crystals.

11. The alumina substrate of claim 8, wherein,
    the AlN layer is mainly composed of single crystals.

12. The alumina substrate of claim 9, wherein,
    the AlN layer is mainly composed of single crystals.

* * * * *